(12) United States Patent
Huang

(10) Patent No.: US 8,026,449 B2
(45) Date of Patent: Sep. 27, 2011

(54) CIRCUIT BOARD WITH ESD PROTECTION AND ELECTRONIC DEVICE USING SAME

(75) Inventor: Mao-Sheng Huang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 407 days.

(21) Appl. No.: 12/422,298

(22) Filed: Apr. 13, 2009

(65) Prior Publication Data
US 2010/0236818 A1 Sep. 23, 2010

(30) Foreign Application Priority Data
Mar. 17, 2009 (CN) .................. 2009 1 0300914.9

(51) Int. Cl.
*H05K 1/18* (2006.01)
(52) U.S. Cl. .................. 174/257; 174/117 FF
(58) Field of Classification Search .................. 174/257, 174/117 FF
See application file for complete search history.

(56) References Cited

U.S. PATENT DOCUMENTS
5,003,273 A * 3/1991 Oppenberg .................. 333/1
2007/0066126 A1 * 3/2007 Dutta et al. .................. 439/493
* cited by examiner

*Primary Examiner* — Chau Nguyen
(74) *Attorney, Agent, or Firm* — Altis Law Group, Inc.

(57) ABSTRACT

A circuit board includes a signal layer and a power supply layer. The signal layer includes a first surface and a second surface opposite to the first surface. A number of pads are formed on the first surface for connecting to an electronic component. The power supply layer is formed on the second surface of the signal layer. The power supply layer includes an insulating substrate and at least one conductor formed on/in the insulating substrate. The conductor which is located under the pads defines a number of holes corresponding to the pads, each hole is substantially aligned with the corresponding pad, and the size of each hole is larger than the size of the corresponding pad.

14 Claims, 3 Drawing Sheets

CIRCUIT BOARD WITH ESD PROTECTION AND ELECTRONIC DEVICE USING SAME

BACKGROUND

1. Technical Field

The present disclosure relates to circuit boards and, particularly, to a circuit board with electrostatic discharge (ESD) protection structure and an electronic device using the circuit board.

2. Description of Related Art

As electronic devices get smaller they become more susceptible to damage from ESD. ESD is the transfer of static electric charge between bodies having different electric potential. ESD has become a critical problem for the electronics industry.

A typical circuit board includes a signal layer and a power supply layer adjacent to the signal layer. The signal layer includes a number of pads formed on a surface of the circuit board and away from the power supply layer. The pads are configured for connecting to pins of electronic components, such as connectors, etc. However, because the distance between the pads and the power supply layer is very small, the static charges on the electronic components may discharge to the circuit board and may destroy or damage the circuit board or introduce noise during the discharge.

What is needed, therefore, is a circuit board with ESD protection which can overcome or at least alleviate the above-described problem.

BRIEF DESCRIPTION OF THE DRAWING

Many aspects of the present circuit board and electronic device can be better understood with references to the accompanying drawings. The components in the drawing are not necessarily drawn to scale, the emphasis instead being placed upon clearly illustrating the principles of the present circuit board and electronic device.

DETAILED DESCRIPTION OF THE EMBODIMENTS

Embodiments of the present disclosure will now be described in detail below, with reference to the accompanying drawings.

Figure 1:
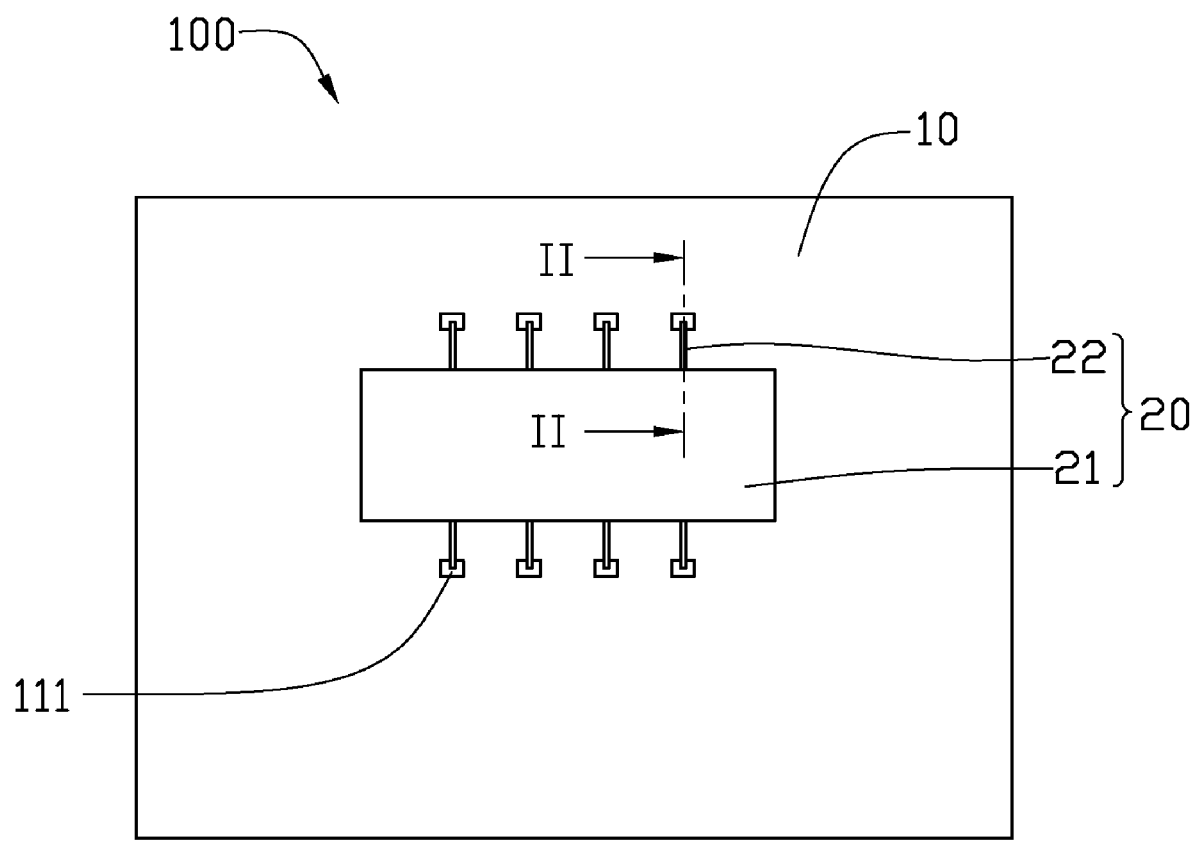
FIG. 1 is a schematic view of an electronic device according to an exemplary embodiment.

Referring to FIG. 1, an electronic device 100, according to an exemplary embodiment, is shown. The electronic device 100 includes a circuit board 10 and at least one electronic component 20 mounted on the circuit board 10.

The electronic component 20 can be an integrated circuit, an image sensor, a connector or the like. In the present embodiment, the electronic component 20 is a connector. The electronic component 20 includes a main body 21 and a number of signal pins 22 electrically connected with the main body 21.

Figure 2:
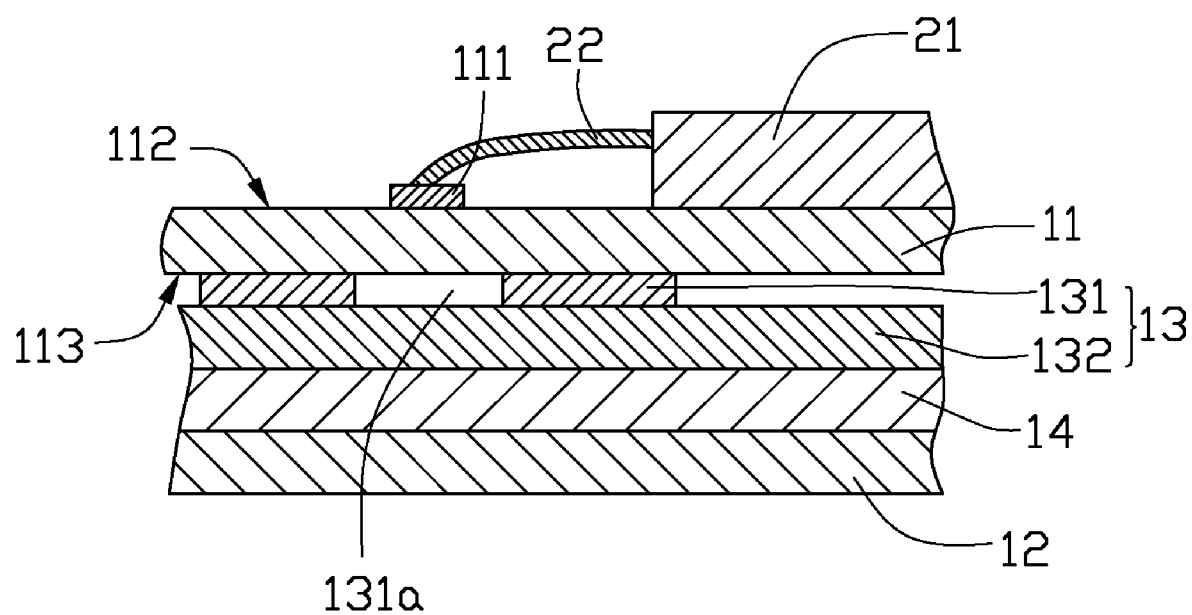
FIG. 2 is a cross-sectional view taken along line II-II of FIG. 1.
Figure 3:
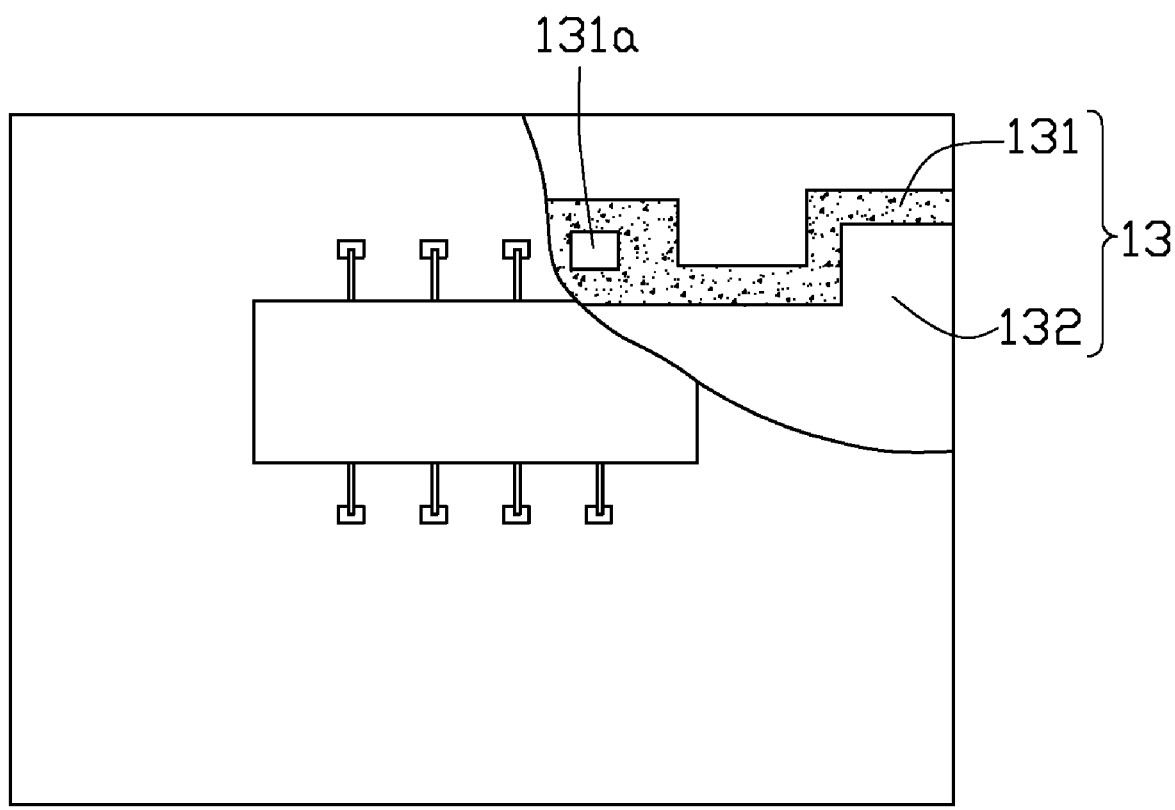
FIG. 3 is a cut-away view of the electronic device of FIG. 1.

Further referring to FIGS. 2 and 3, the circuit board 10 is a multi-layer circuit board. In the present embodiment, the circuit board 10 includes a first signal layer 11, a second signal layer 12, a power supply layer 13, and a ground layer 14. The first signal layer 11, the power supply layer 13, the ground layer 14, and the second signal layer 12 are stacked in sequence.

The first signal layer 11 and the second signal layer 12 are wiring layers for transmitting signals. The first signal layer 11 includes a first surface 112 away from the power supply layer 13 and a second surface 113 opposite to the first surface 112. The first signal layer 11 includes a number of pads 111 for connecting to the signal pins 22 of the electronic component 20, respectively. The pads 111 are located on the first surface 112 of the first signal layer 11.

The power supply layer 13, formed on the second surface 113 of the first signal layer 11, can be connected to a power source (not shown) to provide power for the first signal layer 11, the second signal layer 12, and the component 20 mounted on the circuit board 10. The power supply layer 13 includes an insulating substrate 132 and at least one strip-shaped conductor 131 formed on/in the insulating substrate 132. The strip-shaped conductor 131 can be copper or gold or other conducting material.

The conductor 131, which is located under the pads 111, defines a number of holes 131a corresponding to the pads 111. Each hole is substantially aligned with the corresponding pad 111. The size of each pad 111 is smaller than that of the corresponding hole 131a. Preferably, the distance between the pad 111 and the edge of the corresponding hole 131a is equal to or bigger than 90 mils. Because of the holes 131a, the distance between the pads 111 and the conductor 131 is increased, thus, the static electricity on the electronic component 20 can be prevented from discharging to the conductor 131 to destroy the circuit board 10 or introduce noise. In the present embodiment, the shape of the hole 131a is same to the shape of the corresponding pad 111.

The ground layer 14 is configured for providing a grounding point for some circuits of the circuit board 10 and/or some electronic components mounted on the circuit board 10.

While certain embodiments have been described and exemplified above, various other embodiments will be apparent to those skilled in the art from the foregoing disclosure. The present invention is not limited to the particular embodiments described and exemplified, and the embodiments are capable of considerable variation and modification without departure from the scope of the appended claims.

What is claimed is:

1. A circuit board comprising:
   a signal layer comprising a first surface and a second surface opposite to the first surface, a plurality of pads being formed on the first surface for connecting to an electronic component; and
   a power supply layer formed on the second surface of the signal layer, the power supply layer comprising an insulating substrate and at least one conductor formed on/in the insulating substrate, the conductor being located under the pads and defining a plurality of holes corresponding to the pads, each hole being substantially aligned with the corresponding pad, and the size of each hole being larger than the size of the corresponding pad.

2. The circuit board as claimed in claim 1, wherein the distance between the pad and the edge of the corresponding hole is equal to 90 mils.

3. The circuit board as claimed in claim 1, wherein the distance between the pad and the edge of the corresponding hole is bigger than 90 mils.

4. The circuit board as claimed in claim 1, wherein the shape of the hole is same as the shape of the corresponding pad.

5. The circuit board as claimed in claim 1, further comprising a ground layer stacked on a surface of the power supply layer away from the signal layer.

6. The circuit board as claimed in claim 5, further comprising another signal layer stacked on a surface of the ground layer away from the power supply layer.

7. The circuit board as claimed in claim 1, wherein the conductor of the power supply layer is copper or gold.

8. An electronic device comprising:
an electronic component; and
a circuit board comprising:
   a signal layer comprising a first surface and a second surface opposite to the first surface, a plurality of pads being formed on the first surface for connecting to the electronic component; and
   a power supply layer formed on the second surface of the signal layer, the power supply layer comprising an insulating substrate and at least one conductor formed on/in the insulating substrate, the conductor being located under the pads and defining a plurality of holes corresponding to the pads, each hole being substantially aligned with the corresponding pad, and the size of each hole being larger than the size of the corresponding pad.

9. The electronic device as claimed in claim 8, wherein the distance between the pad and the edge of the corresponding hole is equal to 90 mils.

10. The electronic device as claimed in claim 8, wherein the distance between the pad and the edge of the corresponding hole is bigger than 90 mils.

11. The electronic device as claimed in claim 8, wherein the shape of the hole is same to the shape of the corresponding pad.

12. The electronic device as claimed in claim 8, further comprising a ground layer stacked on a surface of the power supply layer away from the signal layer.

13. The electronic device as claimed in claim 12, further comprising another signal layer stacked on a surface of the ground layer away from the power supply layer.

14. The electronic device as claimed in claim 8, wherein the conductor of the power supply layer is copper or gold.

* * * * *